United States Patent [19]

Iyogi et al.

[11] Patent Number: 4,855,251

[45] Date of Patent: Aug. 8, 1989

[54] METHOD OF MANUFACTURING ELECTRONIC PARTS INCLUDING TRANSFER OF BUMPS OF LARGER PARTICLE SIZES

[75] Inventors: Kiyoshi Iyogi; Koji Yamakawa, both of Tokyo; Nobuo Iwase, Kamakura, all of Japan

[73] Assignee: Kabushiki Kaisha Toshiba, Kawasaki, Japan

[21] Appl. No.: 267,707

[22] Filed: Nov. 3, 1988

Related U.S. Application Data

[63] Continuation of Ser. No. 64,397, Jun. 22, 1987, abandoned.

[30] Foreign Application Priority Data

Jun. 26, 1986 [JP] Japan ................................ 61-150445

[51] Int. Cl.$^4$ ............................................. H01L 21/92
[52] U.S. Cl. ...................................... 437/183; 437/182; 437/230; 437/172
[58] Field of Search ............... 437/183, 187, 203, 245, 437/182, 170, 172, 230; 357/67, 71; 204/47.5, 52.1, 52.5

[56] References Cited

U.S. PATENT DOCUMENTS 3,621,564 11/1971 Tanaka et al. ........................... 29/590
4,494,688 1/1985 Hatada et al. ..................... 228/180 A

FOREIGN PATENT DOCUMENTS 2460347 1/1981 France ................................ 204/47.5
57-152147 9/1982 Japan .
60-92648 5/1985 Japan .

OTHER PUBLICATIONS

H. Y. Chen, "Current Distribution During the Electrodeposition of Gold," *J. Electrochem. Soc.*, vol. 117, No. 5, May 1970, pp. 609-614.

Hatada et al., "New Film Carrier Assembly Technology Transferred Bump Tab", Proc. IEEE 1986 Symposium, Sep. 1986, pp. 122-127.

*Primary Examiner*—Brian E. Hearn
*Assistant Examiner*—T. N. Quach
*Attorney, Agent, or Firm*—Oblon, Spivak, McClelland, Maier & Neustadt

[57] ABSTRACT

According to the present invention, a method is provided of manufacturing electronic parts, comprising a first step of forming on the surface of a substrate a bump wherein the metal particles of that portion of the bump which contacts the surface of the substrate have a larger diameter than the metal particles of that portion of the bump which does not contact the surface of the substrate, a second step of transferring the bump to an electrode lead, and a third step of connecting an electrode lead to a predetermined electrode section of the semiconductor chip, by means of the transferred bump. The method of the present invention ensures that the bump does not fall off during the electroplating and washing steps, and ensures a high-strength bond between the transferred bump and the electrode section of a semiconductor chip.

9 Claims, 2 Drawing Sheets

METHOD OF MANUFACTURING ELECTRONIC PARTS INCLUDING TRANSFER OF BUMPS OF LARGER PARTICLE SIZES

This application is a continuation of application Ser. No. 064,397, filed on June 22, 1988, now abandoned.

BACKGROUND OF THE INVENTION

This invention relates to a method of manufacturing electronic parts, based on the transferred bump process.

Recent efforts aimed at miniaturizing a semiconductor chip used in, for example, an IC, LSI, etc., have been accompanied by efforts to reduce the size of its package. The package has a role of an electrode lead to extend from an aluminium electrode on the semiconductor chip, thereby to allow for its easy handling and to protect it from external pressure. The extending of a lead from the aluminium electrode of the semiconductor chip to the terminal of the package can be conveniently effected by use of the tape automated bonding (TAB) process.

The TAB process consists in forming a bump on the electrode and effecting connection between the bump and the electrode lead. It is necessary to use electroplating in order to mount an Au bump on the Al electrode of the semiconductor substrate. However, since it is difficult to directly adhere an Au bump to an Al electrode, the customary process is to deposit a multiple barrier metal mass composed of, for example, Cu, Cr and Ti on the Al electrode, before performing plating.

As a result, a bump-transferring process has been devised which comprises the steps of first forming a bump on a substrate, transferring the bump to a lead, and then to the desired electrode, and thermally pressing the bump to effect the connection with the electrode (Japanese Patent Disclosure Nos. 57-152147 and 60-92648). This proposed process dispenses with the aforementioned barrier metal, thereby simplifying the formation of the bump and the bump assembly, and enabling a plurality of electrodes to be simultaneously connected to terminals.

FIGS. 1A to 1E show the sequential steps of the bump-transferring process. As is shown in FIG. 1A, substrate 5 on which a bump is to be formed is constructed by laminating conductive layer 2, conductive oxide layer 3, and resist pattern 4, in that order, on base-substrate 1. Bump 6 is electroplated in the bump-forming opening of substrate 5. Conductive oxide layer 3 should preferably be prepared from a material which can be readily connected to gold bump 6 and easily released from bump 6 when it is transferred to the lead. In the second step, (FIG. 1B), electrode lead member 8, supported on insulating film 7, is placed on bump 6. Thereafter, heated bonding tool 9 is pressed on electrode lead member 8, thereby transferring bump 6 to electrode lead 8 (FIG. 1C). Later, as can be seen in FIG. 1D, bump 6 transferred to electrode lead 8 is positioned above al electrode (bonding pad) 12 exposed out of passivation layer 11 of semiconductor chip 10. Thereafter, previously heated bonding tool 9 is pressed on electrode lead 8, thereby connecting electrode lead 8 to Al electrode 12, with bump 6 interposed therebetween.

However, the above-mentioned bump-transferring process has drawbacks in that the bump tends to peel off from an oxide layer, to which it is adhered, during the step of electroplating the bump on the substrate and also during the subsequent bump-washing step, thus resulting in a decline in throughput.

SUMMARY OF THE INVENTION

This invention is intended to provide a method of manufacturing electronic parts, based on a bump-transferring process which prevents a bump from falling off during the electroplating and washing steps, and ensures a high bonding strength between the transferred bump and the electrode section of a semiconductor chip.

To attain the above-mentioned object, the present invention provides a bump in which the metal particles in that portion of a bump contacting a substrate are of a larger size than those which are not brought into contact with the substrate.

It is preferable, from the viewpoint of manufacturing, that the particles in that portion of a bump contacting a substrate have a diameter larger than 1 $\mu$m, that the bump have a thickness of 15~25 $\mu$m, and that the portion of a bump which is composed of the particles having a larger diameter has a thickness of less than 2 $\mu$m. The bump can be prepared from gold, copper, etc.

In order to form a bump having the above-defined particle size distribution, it is advisable to set the initial electroplating current density at 2 to 5 times that which is applied thereafter. Either cyanide solution (KAu(CN)$_2$ etc.) or non-cyanide solution (Na$_3$Au(SO$_4$)$_2$ etc.) can be used for the plating solution.

The present invention offers the advantages in that the particles in that portion of a bump which contacts a substrate are of a larger size than those which do not contact the substrate, thereby ensuring a stronger adhesive bond between the bump and substrate, and enabling the bump to be readily removed from the substrate when it is to be transferred to the electrode lead, and thus ensuring a high-strength bond between the bump and the electrode section of the semiconductor chip, due to the surface of the removed bump being free from irregularities.

DETAILED DESCRIPTION OF THE PREFERRED EMBODIMENTS

Example 1

Figure 1A:
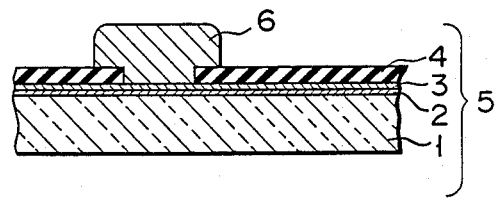
FIGS. 1A to 1E show the sequential steps of manufacturing an electronic part, by use of the bump-transferring method.

Cr conductive layer 2, having a thickness of 1000 Å, and ITO (Indium Tin Oxide; InSnO$_2$) conductive oxide layer, having a thickness of 2000 Å, were thermally deposited on glass base-substrate 1, in that order. Later, resist pattern 4 acting as a mask, wherein a bump-forming region was perforated, was formed on ITO layer 3 by means of photoetching, thereby completing substrate 5. Thereafter, substrate 5 was overturned so as to form a uniform plating layer, and was dipped, in this state, in a gold-electroplating cyanide solution (65° C., stirred at any time). Electroplating was performed for 30 seconds, with the initial current density increased to 3 times the generally recommended level of 1 A/dm$^2$. Electroplating then continued under the abovementioned recommended level. This resulted in gold bump 6 being formed with a thickness of 25 $\mu$m (FIG. 1A).

Figure 2:
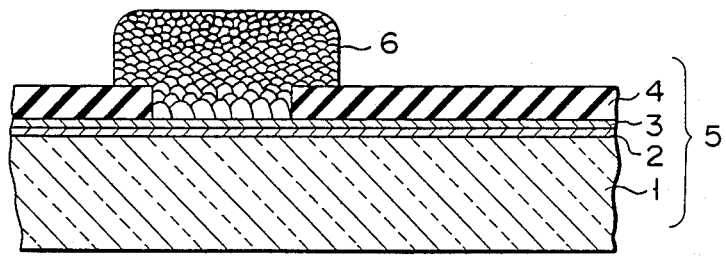
FIG. 2 is a sectional view of the bump embodying the present invention, which has been completely plated.

When observation was made of the vertical section of bump 6, a crystal particle size distribution such as that indicated in FIG. 2 was observed; i.e. the crystals contacting ITO layer 3 had a particle size larger than 1 $\mu$m. The crystals lying thereon, namely, those which do not contact ITO layer 3, had a particle size of about 5000 Å.

Figure 1B:
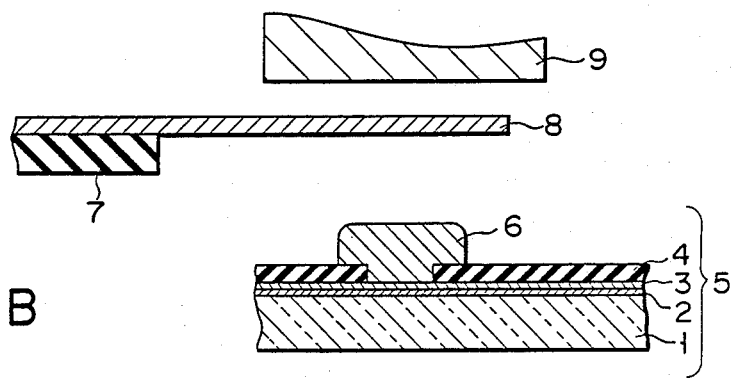
Figure 1C:
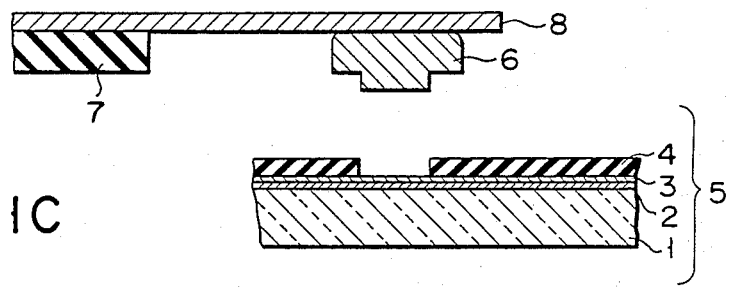

As is indicated in FIG. 1B, copper electrode lead 8, supported by polyimide film 7 and plated with tin, was set above bump 6. Electrode lead 8 was pressed on bump 6 by means of bonding tool 9 heated to 280° C. for 2 seconds, under the pressure of 20 g per Pin (lead number). Later, bonding tool 9 was removed and electrode lead 8 was peeled off from substrate 5, thus enabling bump 6 to be transferred to electrode lead 8, as can be seen in FIG. 1C.

Figure 1D:
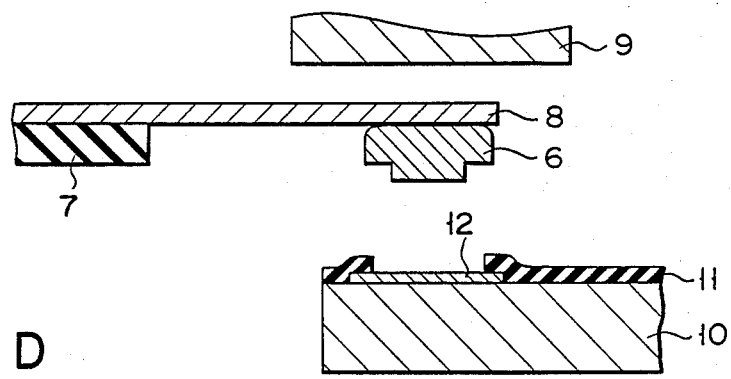
Figure 1E:
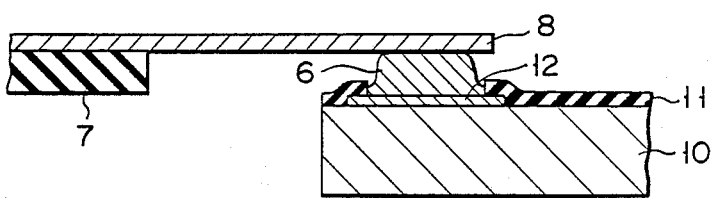

Later, as is shown in FIG. 1D, transferred bump 6 was set above Al electrode (bonding pad) 12 exposed out of passivation layer 11 of semiconductor chip 10, and bonding tool 9 was positioned above electrode lead 8. Using bond tool 9, bump 6 was thermally pressed onto Al electrode 12 for 2 seconds, at a temperature of 380° C., under the pressure of 80 g for 1 Pin. As is shown in FIG. 1E, electrode 8 was connected to Al electrode 12, with bump 6 interposed therebetween. The bonding strength between bump 6 and Al electrode 12 indicated 40 g/lead.

When a bump is formed by the above-mentioned process, the surface of ITO layer 3 is activated because the initial current density is high, and the metal particles impinge on ITO layer 3 at a high speed, thus presumed to increase bonding strength.

Example 2

Electroplating was applied for 3 seconds to a substrate on which a bump was to be formed, with the initial current density increased to 5 times the generally recommended level of 1 A/dm$^2$. Subsequently, electroplating was continued at this recommended level. Then, as is indicated in FIG. 2, a gold bump 6 was formed on the substrate 5, in such a manner that the portion of the bump contacting the substrate consisted of particles larger than those in other portions thereof. It was confirmed that use of the above method effectively prevented the bump formed thereby from peeling off from or falling off the substrate.

Control

A bump was formed on a substrate substantially in the same manner as in Example 1, except that electroplating was performed with the generally recommended current level of 1 A/dm$^2$ being sustained throughout the process. The bump thus formed was connected to the Al electrode section of a semiconductor chip. Observation of the vertical section of an electroplated gold bump showed that the crystal particles of the bump all had a diameter of about 5000 Å, thereby indicating that this method failed to produce a distribution of crystal particle diameters such as was obtained in Examples 1 and 2.

In this Control, the bump either peeled off from fell off the substrate during the electroplating step and the succeeding washing step. The bonding strength between the bump and Al electrode was found to be 10 g/lead.

It should be noted that the present invention is not limited to the above-mentioned examples. Any other method of forming a bump is applicable, provided that the bump is prepared in such a manner that those portions of a bump which contact the substrate are formed of larger crystal particles than the other portions thereof.

What is claimed is:

1. A method of manufacturing electronic parts, comprising:
   a first step of forming on the surface of a substrate a bump with substantially all the metal crystal particles of that portion of the bump which contacts the surface of the substrate having larger diameters than the metal crystal particles of that portion of the bump which does not contact the surface of the substrate;
   a second step of transferring the bump to an electrode lead; and
   a third step of connecting an electrode lead to the predetermined electrode section of the semiconductor chip, by means of the transferred bump.

2. The method according to claim 1, wherein the metal crystal particles of that portion of the bump which contacts the substrate have a diameter larger than 1 $\mu$m.

3. The method according to claim 1, wherein the bump is formed by electroplating.

4. The method according to claim 3, wherein the initial current density of electroplating applied to the formation of a bump is defined to be 2-5 times the current density which is used thereafter.

5. The method according to claim 1, wherein the bump has a thickness of 15-25 $\mu$m.

6. The method according to claim 1, wherein the bump is prepared from gold or copper.

7. The method according to claim 1, wherein the substrate on which the bump is to be formed is constructed by laminating a conductive layer and conductive oxide layer, in that order, on the basesubstrate.

8. The method according to claim 7, wherein the base-substrate is prepared from glass, the conductive layer from chromium, and the conductive oxide layer from ITO.

9. The method according to claim 1, wherein the layer composed of the metal crystal particles having a larger diameter has a thickness of less than 2 $\mu$m.

* * * * *